(12) United States Patent
Sung

(10) Patent No.: US 6,814,130 B2
(45) Date of Patent: *Nov. 9, 2004

(54) METHODS OF MAKING DIAMOND TOOLS USING REVERSE CASTING OF CHEMICAL VAPOR DEPOSITION

(76) Inventor: Chien-Min Sung, No. 4 Lane 32, Chung-Cheng Rd., Tansui, Taipei County (TW), 23911

(*) Notice: Subject to any disclaimer, the term of this patent is extended or adjusted under 35 U.S.C. 154(b) by 209 days.

This patent is subject to a terminal disclaimer.

(21) Appl. No.: 10/002,395

(22) Filed: Oct. 19, 2001

(65) Prior Publication Data

US 2002/0094379 A1 Jul. 18, 2002

Related U.S. Application Data

(63) Continuation-in-part of application No. 09/687,444, filed on Oct. 13, 2000.

(51) Int. Cl.[7] .......................... B22B 27/00; C23C 16/27
(52) U.S. Cl. ................. 164/74; 264/29.1; 427/135; 427/249.8
(58) Field of Search ............................... 427/135, 249.8; 164/74; 264/29.1

(56) References Cited

U.S. PATENT DOCUMENTS

| | | |
|---|---|---|
| 4,952,832 A | 8/1990 | Imai et al. |
| 5,329,208 A | 7/1994 | Imai et al. |
| 5,355,568 A | 10/1994 | Imai et al. |
| 5,390,401 A | 2/1995 | Shikata et al. |
| 5,401,544 A | 3/1995 | Nakahata et al. |
| 5,446,329 A | 8/1995 | Nakahata et al. |
| 5,576,589 A | 11/1996 | Dreifus et al. |
| 5,776,246 A | 7/1998 | Tanabe et al. |
| 6,051,063 A | 4/2000 | Tanabe et al. |
| 6,159,604 A | 12/2000 | Adachi |
| 6,222,299 B1 | 4/2001 | Graebner et al. |
| 6,275,123 B1 | 8/2001 | Tanaka et al. |
| 6,278,342 B1 | 8/2001 | Ella |

Primary Examiner—Bret Chen
(74) Attorney, Agent, or Firm—Thorpe North & Western, LLP

(57) ABSTRACT

The present invention provides diamond tools, and a method for the formation thereof, using CVD techniques. In one aspect, a mold is provided which has an interface surface configured to inversely match a configuration intended for the working surface of a diamond layer in a tool. After the mold is provided, various CVD techniques may be used to deposit diamond layers upon the diamond interface surface of the mold. Following diamond deposition upon the diamond interface surface, the mold may be removed by various means, such as chemical etching, or the mold may be left intact for certain applications, such as SAW filters. Thus, the working surface of the diamond receives a shape which inversely corresponds to the configuration of the mold's diamond interface surface. The diamond layer may then be incorporated into a tool, if such incorporation has not yet taken place.

73 Claims, 4 Drawing Sheets

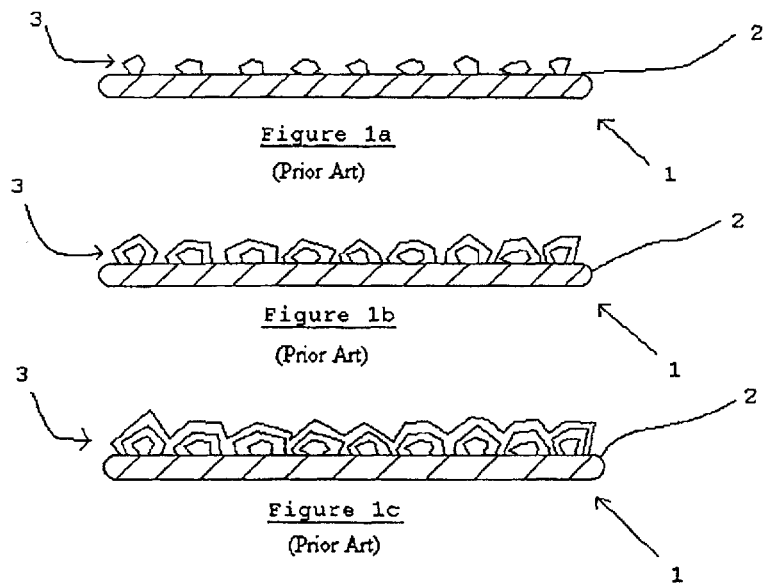
Figure 1a
(Prior Art)
Figure 1b
(Prior Art)
Figure 1c
(Prior Art)
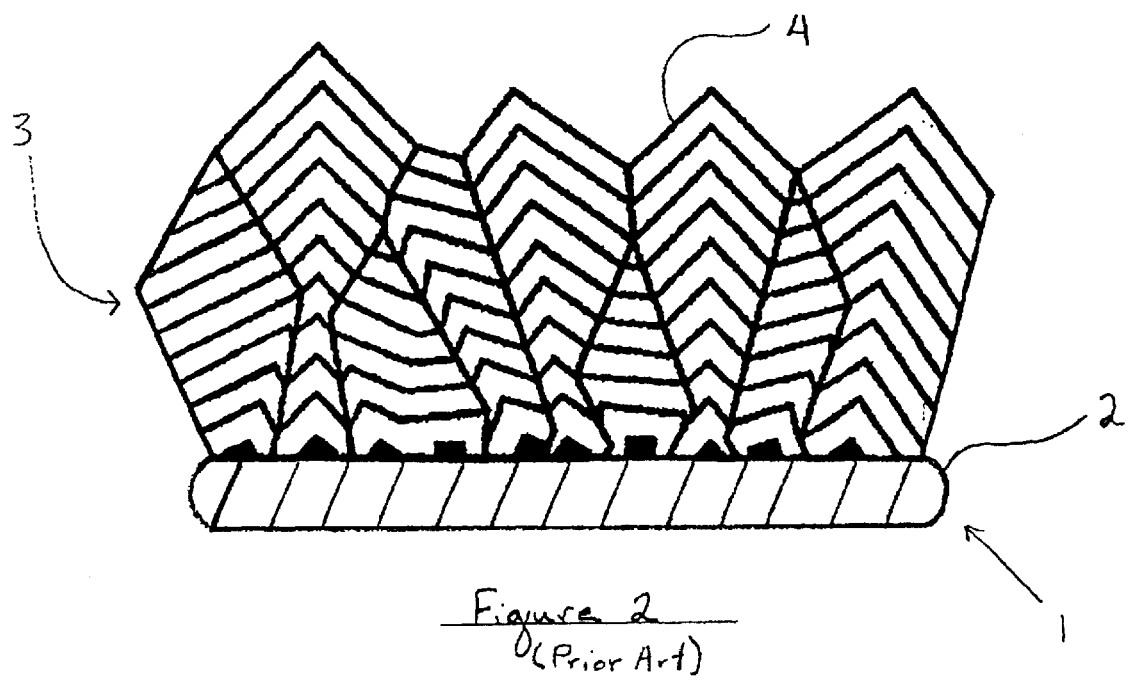
Figure 2
(Prior Art)

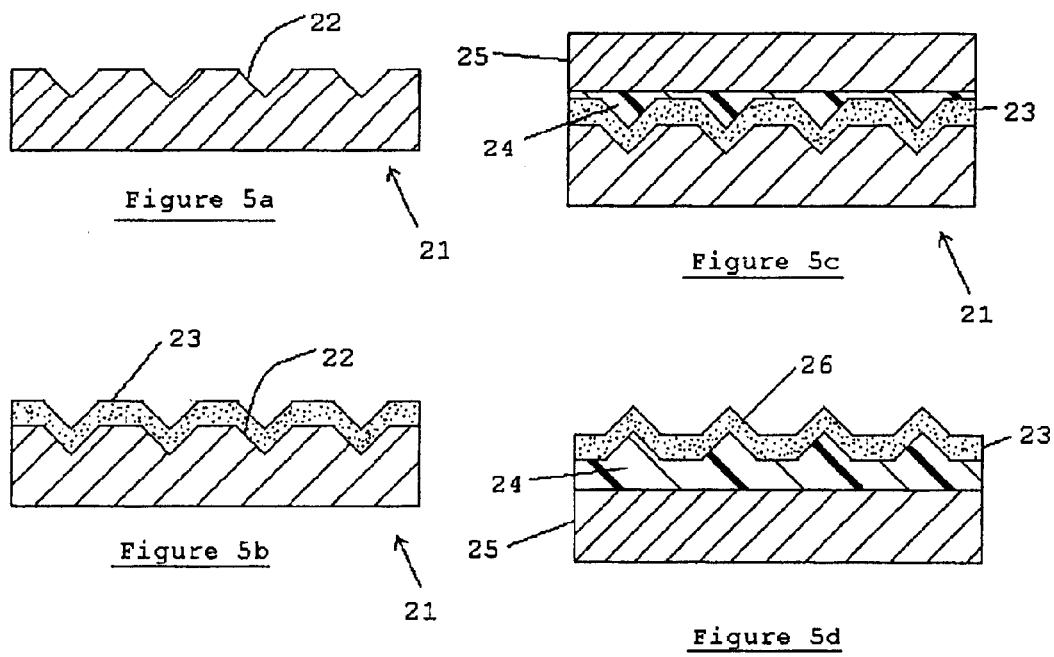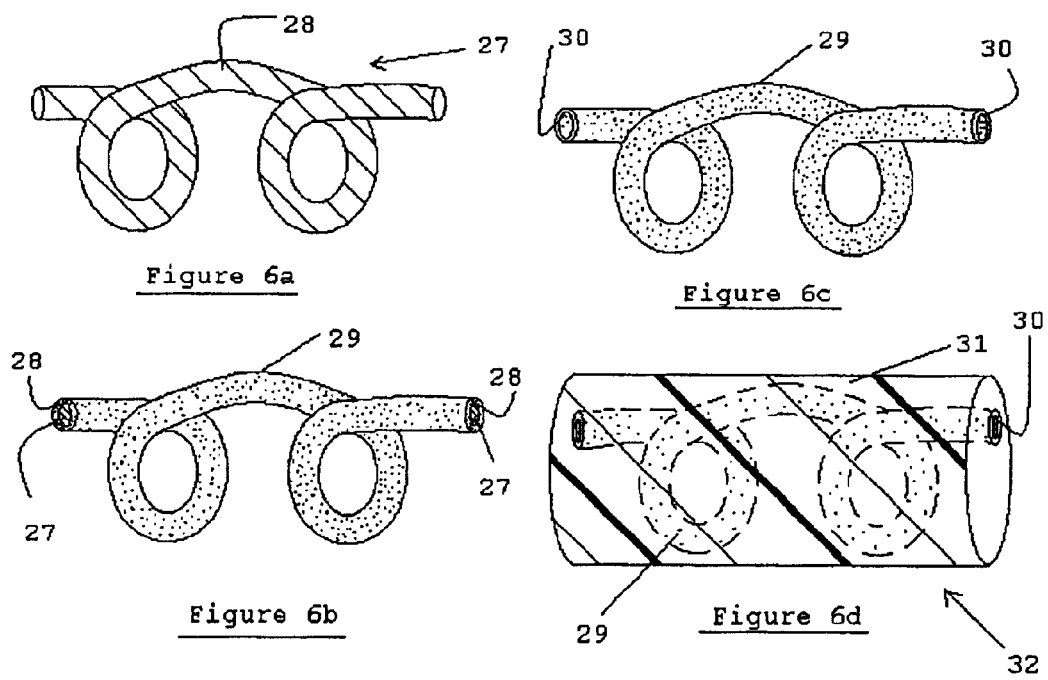

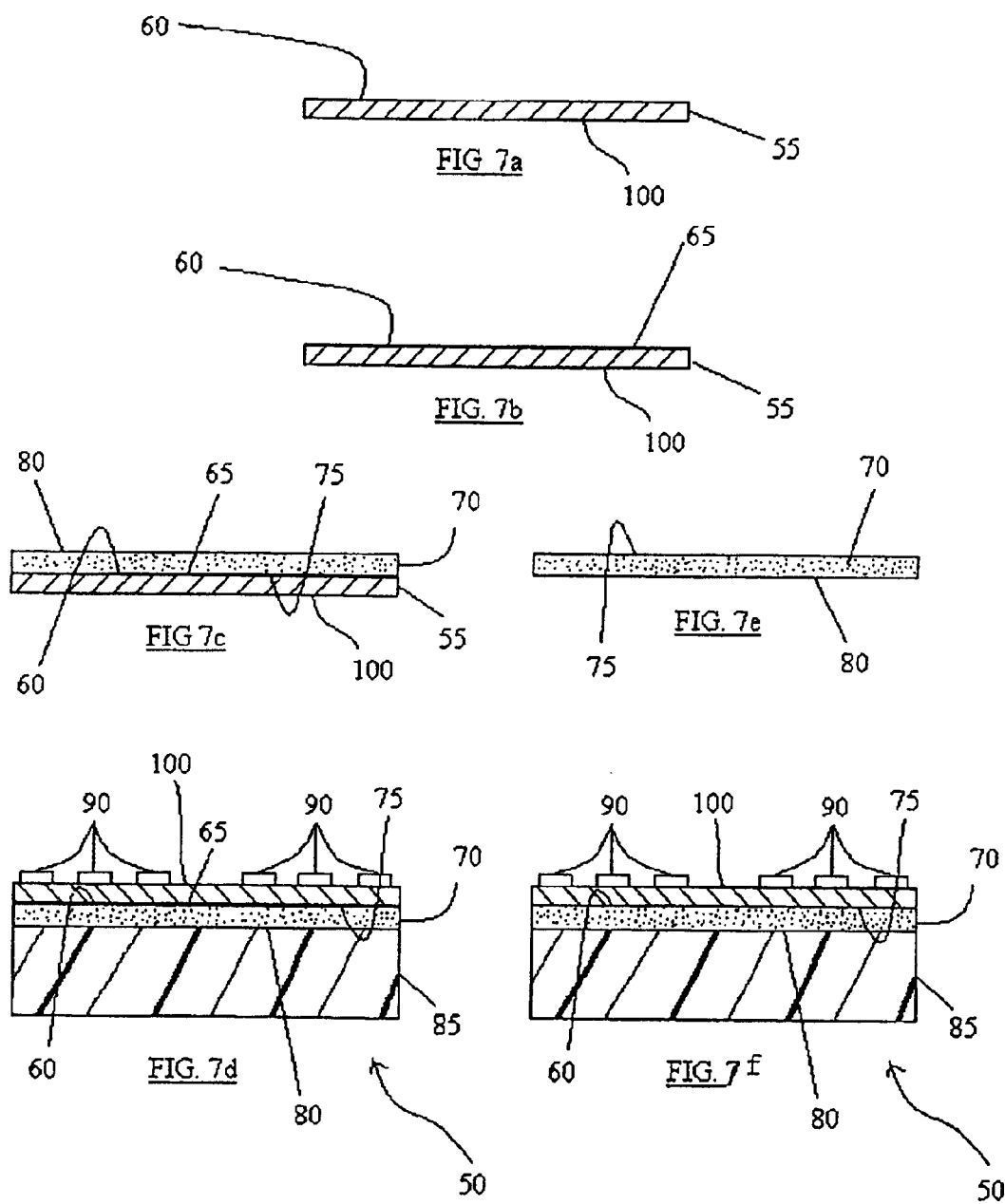

METHODS OF MAKING DIAMOND TOOLS USING REVERSE CASTING OF CHEMICAL VAPOR DEPOSITION

PRIORITY DATA

This application is a continuation-in-part of U.S. patent application Ser. No. 09/687,444 filed on Oct. 13, 2000, which is incorporated herein by reference in its entirety.

THE FIELD OF THE INVENTION

The present invention relates to devices incorporating super-hard materials, such as diamond or diamond-like substances, and methods for making such devices. More particularly, the present invention relates to the use of chemical vapor deposition for making devices incorporating super-hard materials.

BACKGROUND OF THE INVENTION

Diamond and diamond-like substances have many properties, such as wear resistance, thermal, conductivity, acoustic transmission, and corrosion inertness, which make them desirable for a variety of industrial applications. To this end, diamond and diamond-like substances have been incorporated into tools of various purpose such as saw blades and drill bits. One method for incorporating diamond or diamond-like materials into a tool is known as chemical vapor deposition (CVD).

Various CVD techniques have been used in connection with depositing diamond or diamond-like materials onto a substrate. Typical CVD techniques use gas reactants to deposit the diamond or diamond-like material in a layer, or film. These gases generally include a small amount (i.e. less than about 5%) of a carbonaceous material, such as methane, diluted in hydrogen.

During the CVD process, the gases are heated to a temperature sufficient to separate the carbon atoms from the carbonaceous material, to which they are bound. Normally, such a separation would cause the carbon to be deposited on the substrate as amorphous carbon or graphite. However, when free carbon atoms are surrounded by hydrogen atoms, the carbon maintains an electron configuration of diamond (i.e. $Sp^3$ bonding) and deposits on the substrate as such. Further, even with the formation of non-diamond carbon on a substrate, a high hydrogen concentration readily converts the amorphous carbon or graphite back to methane. Thus, the concentration of hydrogen plays a key role in catalyzing the formation of diamond, and controlling the quality and purity thereof.

Various ways of heating the CVD gas mixture have been used, including hot filament, microwave agitation, oxyacetylene flame, and arc jet. While the temperature required for diamond deposition on a substrate is typically in the range of 800° C. to 900° C., the reaction temperature for the gases used is much higher. In fact, the higher the reaction temperature is, the more complete the decomposition of the gases into hydrogen and carbon atoms, and the faster the deposition rate of the diamond onto the substrate.

Of the above-recited heating methods, the hot filament method results in the slowest deposition rate (about 1 micron per hour), as it is only capable of reaching a temperature of about 2,200° C. in the filament. The microwave agitation method may achieve an intermediate deposition rate of about 10 microns per hour. The oxyacetylene flame method is capable of achieving a higher temperature than microwave agitation, and may yield a deposition rate of over 20 microns per hour. The arc jet method is capable of achieving the highest temperature (i.e. about 6,000° C.), and therefore yields the highest deposition rate, such as about 50 microns per hour.

It has been shown that higher deposition rates cause the diamond or diamond-like materials to be deposited over smaller areas of substrate surface. Thus, a higher rate of deposition may be more, or less, suitable for an application depending on the size of the device and the desired characteristics of the diamond or diamond-like portions thereof.

In forming a layer of diamond, or diamond-like material on a substrate using CVD techniques, a plurality of diamond grains, or "seeds," may be first placed upon the substrate surface. The placement of such seeds may be accomplished using CVD itself. These seeds act as diamond nuclei and facilitate the growth of a diamond layer outwardly from the substrate as carbon vapor is deposited thereon. As a result, the growing side of the diamond layer becomes increasingly coarse in grain size, and must ultimately be ground and polished to a smooth finish such as by a mechanical means, in order to be suitable for many industrial applications. However, as diamond and diamond-like substances are among the hardest known materials, such mechanical grinding and polishing is difficult and tedious. Moreover, the cost of polishing often exceeds the cost for the diamond and film itself. In addition, mechanical polishing inevitably introduces micro-cracks or variations on the diamond surface. Such cracks and variations are detrimental to certain applications. For example, if the diamond is used make a surface acoustic wave (SAW) filter which is used to propagate surface acoustic waves, micro-cracks or variations in the diamond surface will introduce noise into the signal and therefore deteriorate the quality of the filtered wave.

Further, machine finishing is incapable of producing certain configurations in a diamond layer which are desirable or necessary for many industrial applications. For example, drilling a square hole through a diamond layer for creation of a wire drawing die that produces square shaped wires, is extremely difficult if not impossible.

In addition to the above-recited disadvantages, diamond or diamond-like materials which are produced by conventional CVD techniques are inefficient for making devices of certain purpose. Particularly, in many industrial applications, the surface of the diamond film requires a particular configuration in order to be of use. In such applications, the non-surface portion of the diamond or diamond-like material is unimportant to the performance of the device. However, conventional CVD techniques create the working surface by depositing thick films of diamond on the substrate and building up of the working surface to a body. Such a process wastes time and effort by slowly depositing a thick non-surface body of diamond or diamond-like materials.

As such, a process for making super-hard material containing devices which require little or no post synthesis work to achieve a finished product continues to be sought through on-going research and development efforts.

SUMMARY OF THE INVENTION

Accordingly, the present invention provides diamond tools, and a methods for making diamond tools that do not require post fabrication polishing or finishing of the working surface. As such, the present device and method is capable of providing a super-hard working surface which has no micro-cracks or undesired variations.

In one aspect, the diamond tool comprises a diamond layer having working surface with a shape which inversely corresponds to the configuration of a diamond interface surface in a mold, and further has a non-diamond layer joined to the diamond layer. In another aspect, the present invention encompasses a surface acoustic wave filter having a diamond layer, a thin nucleation enhancer layer disposed on the diamond layer, and a piezoelectric layer disposed on the nucleation enhancer layer.

The method of the present invention for making a diamond tool may include or consist of the steps of: a) providing a mold having a diamond interface surface configuration which inversely matches a configuration intended for a working surface of the tool; b) coating said diamond interface surface with diamond using a chemical vapor deposition (CVD) technique to form a diamond layer; and c) separating the mold, from the diamond layer to expose the working surface. In one aspect of the invention, the mold may be a ceramic mold, and the method may further include the step of coating the interface surface with a thin layer of a nucleation enhancer layer. The diamond layer is then formed on the nucleation enhancer layer, and the working surface receives the intended configuration from the interface layer. In another aspect of the invention, when the ceramic mold and thin nucleation enhancer are used, the step of separating the mold from the diamond layer may not be necessary to form a desired tool, such as a SAW filter, and therefore may not be employed. As such, the method would include or consist of the steps of: a) providing a ceramic mold having a diamond interface surface configuration which inversely matches a configuration intended for a working surface of the tool; b) forming a thin nucleation enhancer layer on the interface surface; and growing a diamond layer on the thin nucleation enhancer layer using a CVD technique, such that the diamond layer directly contacts the nucleation enhancer layer and receives the intended configuration from the interface surface.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

FIG. 1a is a cross section view of a diamond tool being prepared by any conventional CVD technique, having diamond nuclei deposited upon the substrate surface, as is known in the prior art.

FIG. 1b is a cross section view of a diamond tool being prepared by any conventional CVD technique, to allow the growth diamond nuclei upon the substrate surface, as is known in the prior art.

FIG. 1c is a cross section view of a diamond tool being prepared by any conventional CVD technique, to show the growing nuclei of diamond joined together on the substrate surface, to form a continuous film as is known in the prior art.

FIG. 2 is a cross section of diamond tool having a diamond film showing the diamond growth and resultant diamond surface deposited upon a substrate using any conventional CVD technique, as is known in the prior art.

FIG. 5a is a cross section view of a mold for fabricating a diamond CMP pad dresser in accordance with one aspect of the present invention.

FIG. 5b is a cross section view of a diamond mass formed on a mold for fabricating a diamond CMP pad dresser in accordance with one aspect of the present invention.

FIG. 5c is a cross section view of a diamond mass formed on an ephemeral mold having a resin layer joined, to a hard substrate for fabricating a diamond CMP pad dresser in accordance with one aspect of the present invention.

FIG. 5d is a cross section view of a diamond CMP pad dresser with the mold removed, in accordance with one aspect of the present invention.

FIG. 6a is a side view of a wire coil or pipe mold for fabricating a diamond pipe in accordance with one aspect of the present invention.

FIG. 6b side view of a diamond film deposited on the outside of the wire coil mold of FIG. 6a.

FIG. 6c perspective view of the shows the diamond film of FIG. 6b after dissolving the center metal coil in accordance with one aspect of the present invention.

FIG. 6d is a perspective view of the diamond pipe of FIG. 6c with the fitted inside a holder mass in accordance with one aspect of the present invention.

FIG. 7a is a side view of a ceramic mold for fabricating a SAW filter in accordance with one aspect of the present invention.

FIG. 7b is a side view of the ceramic mold of FIG. 7a having a thin nucleation enhancer layer formed upon an interface surface thereof.

FIG. 7c is a side view of a diamond layer grown on the thin nucleation layer and ceramic mold of FIG. 7b.

FIG. 7d is a side view of a SAW having a diamond layer grown on a thin nucleation layer and ceramic mold, as in FIG. 7c, wherein the ceramic mold is a piezoelectric material which is left in place to serve as a piezoelectric layer, which further has a plurality of interdigital tranducers formed thereon, in accordance with one aspect of the present invention.

FIG. 7e is a side view of a diamond layer as formed in FIG. 7c, which has had the ceramic mold and thin nucleation enhancer layer removed therefrom to expose the working surface thereof in accordance with one aspect of the present invention.

FIG. 7f is a side view of a SAW formed using the diamond layer of 7c, which has a piezoelectric layer and plurality of interdigital transducers formed on a working surface thereof after the removal of the ceramic mold and thin nucleation enhancer layer in accordance with one aspect of the present invention.

DETAILED DESCRIPTION

Figure 3A:
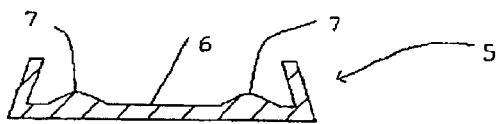
FIG. 3a is cross section view of an metal mold for fabricating a diamond cutting element, or insert, in accordance with one aspect of the present invention.

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," and, "the" include plural referents unless the context clearly dictates otherwise. Thus, for example, reference to a diamond layer containing "a diamond particle" includes one or more of such particles, reference to "a carbon source" includes reference to one or more of such carbon sources, and reference to "a CVD technique" includes reference to one or more of such CVD techniques.

Definitions

In describing and claiming the present invention, the following terminology will be used in accordance with the definitions set forth below.

As used herein, "tool" refers to any object or device which may be used in creating a work product, or acting on a work piece, to accomplish a desired result. Examples of tools include, but are not limited to: saw blades, drill bits, CMP pad dressers, wire drawing dies, cutting elements or inserts, and pipes, hoses, SAW filters, and coils.

As used herein, "super hard" and "superabrasive" may be used interchangeably, and refer to any crystalline, or polycrystalline material, or mixture of such materials which has a Moh's hardness of about 8 or greater. In some aspects, the Moh's hardness may be about 9.5 or greater. Such materials include but are not limited to diamond, polycrystalline diamond (PCD), cubic boron nitride, polycrystalline cubic boron nitride (PCBN) as well as other super hard materials known to those skilled in the art. Super hard materials may be incorporated into the present invention in a variety of forms including particles, grits, films, layers, etc.

As used herein, "substrate" means a non-diamond surface, to which super abrasive particles may be joined in forming a tool. The substrate may be any shape, thickness, or material, required in order to achieve a specific result, and includes but is not limited to metals, alloys, ceramics, and mixtures thereof. Further, the substrate, or base portion may be a tool body in and of itself, or may be a material which is capable of being joined to a tool body.

As used herein, "tool body" refers to a device which makes up a substantial part of a tool, to which a superabrasive component may be joined, either directly, or by an intermediate material, or layer.

As used herein, "metallic" refers to any type of material or compound wherein the majority portion of the material is a metal. As such, various oxide, nitride, and carbide compounds, as well as any other material or compound, containing a greater non-metal portion than metal portion are not considered to be "non-metallic." Examples of various metals considered to be particularly useful in the practice of the present invention include, without limitation: aluminum, tungsten, molybdenum, tantalum, zirconium, vanadium, chromium, copper, and alloys thereof.

As used herein, "ceramic" refers to a non-diamond, non-metallic, material, which is hard, heat resistant, corrosion resistant, and can be polished to have a surface roughness (Ra) of less than about 1 micrometer. Further, as used herein, "ceramic" materials may contain at least one element selected from the group consisting of Al, Si, Li, Zn, and Ga. Oxides, nitrides, and various other compounds which include the above recited elements are known ceramics to those skilled in the art. Additional materials considered to be "ceramics" as used herein, such as glass, are known to those skilled in the art. Examples of specific ceramics useful in the present invention include without limitation, Si, $SiO_2$, $Si_3N_4$, $Al_2O_3$, AlN, BN, TiN, ZrN, GaAs, GaP, $LiTaO_3$, $LiNbO_3$, ZnO, glass, such as soda glass, etc.

As used herein, "interface surface" refers to the surface of a mold, or ephemeral mold, upon which materials used in the fabrication of a diamond layer or film are deposited. Such materials include diamond or other superabrasive particles, as well as peripheral materials used to facilitate diamond layer growth using a CVD technique, such as diamond nucleation enhancers.

As used herein with respect to a mold, "outside surface" refers to a surface of the mold which is not in direct contact with the diamond layer, and upon which interdigital transducers may be formed.

As used herein, "nucleation enhancer" refers to a material, which increases the quality of a diamond layer formed from a plurality of diamond nuclei using a CVD process. In one aspect, the nucleation enhancer may increase the quality of the diamond layer by reducing movement or, or immobilizing diamond nuclei. Examples of nucleation enhancers include without limitation, metals, and various metallic compounds, as well as carbides and carbide forming materials.

As used herein with respect to a nucleation enhancer layer, "thin" refers to the thickness or depth of the layer being sufficiently small so as to not substantially interfere with the transfer of the intended configuration from the interface surface configuration to the working surface. In one aspect, the thickness of the nucleation enhancer may be less than about 0.1 micrometers. In another aspect, the thickness may be less than 10 nanometers. In another aspect, the thickness may be less than about 5 nanometers.

As used herein, "working surface" refers to the surface of a tool, which contacts a workpiece, or performs a friction-involved function during a work process. Alternatively, the working surface of a tool may be a surface which receives an input signal or transmits or output signal, such as an electrical impulse, or other physical or mechanical wave, such as a surface acoustic wave. In one aspect, the working surface of a tool may be a diamond or other superabrasive material layer.

As used herein, "diamond layer," "diamond particle," and "diamond mass" may be used interchangeably, and refer to any structure, regardless of shape, which contains diamond in any form or amount, which can be incorporated into a tool. Thus, for example, a diamond film partially or entirely covering a surface is included within the meaning of these terms. Additionally, a layer of a material, such as metals, acrylics, or composites, having diamond particles disbursed therein is included in these terms.

As used herein, "non-diamond layer" and "non-diamond mass" may be used interchangeably, and refer to any structure regardless of shape, which does not contain any diamond, but which can be joined to a diamond layer in order to form a diamond tool.

As used herein, "chemical vapor deposition," or "CVD" refers to any method of chemically depositing diamond particles in a vapor form upon a surface. Various CVD techniques are well known in the art.

As used herein, "drawing channel" refers to the inner channel, or passage of a wire drawing die, through which wire is drawn.

As used herein, "inversely correspond" refers to the inverse relationship between the configuration of a diamond or superabrasive layer's working surface, and the configuration of a mold's interface surface from which the working surface was made, when such surfaces are oriented in the same direction. In other words, when a working surface of a tool is formed at the interface surface of a mold, the configuration of each will inversely correspond to the other when the surfaces are separated and faced in the same direction. In some instances, the inverse correspondence may result in a mirror image.

As used herein, "nucleation side," "nucleation surface," and similar terms may be used interchangeably, and refer to the side or surface of a diamond or superabrasive layer at which nucleation of diamond particles originated. Otherwise described, the nucleation surface of a diamond or superabrasive layer is the side or surface, which was first deposited upon the interface surface of a mold. In many instances, the nucleation surface may become the working surface of the tool.

As used herein, "growth side," "grown side," and "grown surface" may be used interchangeably and refer to the surface of a superabrasive film or layer which is grows during a CVD process.

As used herein, "Ra" refers to a measure of the roughness of a surface as determined by the difference in height between a peak and a neighboring valley. Further, "Rmax" is a measure of surface roughness as determined by the difference in height between the highest peak on the surface and the lowest valley on the surface.

As used herein, "interdigital transducers" (IDT) and "electrodes" may be used interchangeably and refer to conductive or semi-conductive contacts which are coupled to a piezoelectric layer as known by those skilled in the art in order to create a SAW filter. In one aspect of the present invention, the IDT may be coupled to the piezoelectric layer on an outside surface thereof, or on the interface surface thereof.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited.

As an illustration, a numerical range of "about 1 micrometer to about 5 micrometers" should be interpreted to include not only the explicitly recited values of about 1 micrometer to about 5 micrometers, but also include individual values and sub-ranges within the indicated range. Thus, included in this numerical range are individual values such as 2, 3, and 4 and sub-ranges such as from 1–3, from 2–4, and from 3–5, etc.

This same principle applies to ranges reciting only one numerical value. For example, a range recited as "less than about 5 micrometers" should be interpreted to include all values and sub-ranges between 5 micrometers and 0 micrometers. Furthermore, such an interpretation should apply regardless of the breadth of the range or the characteristics being described.

Invention

It is well known in the art to make diamond tools for various applications using chemical vapor deposition (CVD) techniques. Referring to FIGS. 1a–1c, is shown generally the beginning stages of diamond growth on a tool substrate 2, to form a diamond tool 1, produced by various known CVD processes. Such processes generally entail growing a diamond film 3, with increasing thickness on the outward surface of the tool substrate.

FIG. 2 shows the results of completed diamond film growth using conventional CVD techniques. As the layer of diamond 3 continues to grow, the working surface 4 thereof becomes increasingly rough. Unfortunately, a rough working surface may be unsuitable for many tool applications, such as SAW filters. Therefore, machining of the working surface 4 into a desired configuration is required.

The present invention employs a process of making diamond tools which removes the necessity of post formation machining or finishing, of the working surface 4, and thus dispenses with the significant time and expense associated therewith. Such a process is capable of creating a tool having a diamond or other superabrasive layer working surface that has a shape inversely corresponding to the configuration of an interface surface in a mold, upon which the diamond or other superabrasive layer is deposited. Further, a non-diamond substrate may be joined to the grown side of the diamond or other superabrasive film to form a tool body. As such, the finished working surface is capable of receiving any configuration which may be imparted by a mold without post formation machining.

The diamond or other superabrasive layer working surface may be formed by depositing applicable nuclei, such as diamond nuclei, on the interface surface of a mold and then growing the nuclei into a film or layer using CVD. Such a tool includes, or in some aspects consists of, a diamond or other superabrasive particle layer working surface having a shape inversely corresponding to the configuration of an interface surface in a mold. In some aspects, such a working surface may be the mirror image of the interface surface. Further, a non-diamond layer may be joined to the grown surface afterward to form a tool body.

In one aspect, the process of the present invention includes providing a mold having a diamond interface surface configuration which inversely corresponds to a desired shape for a working surface of the tool, coating said diamond interface surface with diamond using a chemical vapor deposition (CVD) technique to form a diamond layer, and separating the mold from the diamond layer. In another aspect, the process of the present invention consists of providing a mold having an interface surface configuration which inversely corresponds to a desired shape for a working surface of the tool, coating said diamond interface surface with diamond using a CVD technique to form a diamond layer, and separating the mold from the diamond layer. Various CVD techniques are known in the art, and can be employed with the process of the present invention. The result of such a process is that the working surface of the diamond layer receives a configuration which inversely corresponds to the configuration of the diamond interface surface of the mold.

In certain aspects of the present invention, when a ceramic mold is used as will be more fully described below, the process of the present invention may comprise or consist of providing a ceramic mold, having an interface surface configured to inversely match a configuration intended for a working surface of a diamond tool, forming a thin nucleation enhancer layer on the interface surface, and growing a diamond layer on the nucleation enhancer layer using a CVD technique, such that the working surface directly contacts the nucleation enhancer layer and receives the intended configuration from the interface surface of the mold. Subsequently, the diamond layer may be separated from the ceramic mold and the nucleation enhancer layer in order to expose the working surface.

The mold used in the process of the present invention may be of any material sufficient to withstand the conditions of the CVD techniques, and allow the formation of a diamond film, or layer thereon. However, in one aspect, the mold may be made of, or substantially made of, a metallic material. The metallic material may be a member selected from the group consisting of: aluminum, copper, tungsten, molybdenum, tantalum, zirconium, vanadium, and chromium. In another embodiment, the mold may be made of, or made substantially of, non-metals, such as carbides and ceramics, including glass, oxide, and nitride materials. Examples of carbide materials include without limitation, tungsten carbide (WC), silicon carbide (SiC), titanium carbide (TiC), zirconium carbide (ZrC), and mixtures thereof among others. Examples of oxide materials include without limitation, quartz (i.e. crystalline $SiO_2$), corundum or sapphire (i.e. $Al_2O_3$), $LiTaO_3$, $LiNbO_3$, ZnO, and mixtures thereof. Examples of nitride materials include without limitation, silicon nitride ($Si_3N_4$), aluminum nitride (AlN), boron nitride (BN), titanium nitride (TiN), zirconium nitride (ZrN), and mixtures thereof, among others. Examples of glass include all types of glass including soda glass, etc.

In certain aspects of the present invention, for example, in the production of SAW filters, the mold may be made of a piezoelectric material. A wide variety of piezoelectric materials are suitable for use as a mold in the present invention, including many of the ceramic materials listed above. However, in one aspect, the piezoelectric materials used may be a member selected from the group consisting of: $SiO_2$, $Si_3N_4$, $Al_2O_3$, AlN, GaAs, GaP, $LiTaO_3$, $LiNbO_3$, ZnO, Pb(Zr, Ti)$O_3$, $Ta_2O_5$ $Nb_2O_5$, BeO, $L_2B_4O_7$, $KnbO_3$, ZnS, ZnSe, CdS, and mixtures thereof. Further, various carbides having a non-isometric crystalline structure are piezoelectric, such as hexagonally shaped tungsten carbide crystals. A variety of piezoelectric carbides are known to those skilled in the art and may be used herein. In another aspect of the invention, the piezoelectric material may be obtained from a single crystal ingot in order to control the crystal orientation of the piezoelectric material and provide a high electromechanical coupling factor.

Certain non-metallic materials, such as the carbide and ceramic materials recited above are particularly well suited for use as a mold in the present invention because of their hardness and ability to achieve an extremely smooth interface surface. A smooth interface surface is particularly important when making a tool that requires a smooth working surface. In many cases, the interface surface of a ceramic material may be polished to have a roughness (Ra) of less than about 10 micrometers. In other instances, the surface roughness (Ra) may be less than about 5 micrometers. In yet other instances, the surface roughness (Ra) may be less than about 1 micrometer. Various methods for polishing the interface surface to achieve such a degree of smoothness, for example with diamond powder or paste, or other diamond tools are well known to those skilled in the art.

While ceramics and other non-metal materials are able to achieve a smooth interface surface, many of these materials, such as oxides, are unable to nucleate diamond and retain it in place very well. Therefore, in order to overcome such a deficiency, in one aspect of the present invention, a thin nucleation enhancer layer may be coated upon the interface surface of the mold. Diamond nuclei are then placed upon the intermediate layer, and the growth of the diamond layer proceeds via CVD as described herein.

A variety of suitable materials will be recognized by those in skilled in the art which can serve as a nucleation enhancer. In one aspect of the present invention, the nucleation enhancer may be a material selected from the group consisting of metals, metal alloys, metal compounds, carbides, carbide formers, and mixtures thereof. Examples of carbide forming materials include without limitation, tungsten (W), tantalum (Ta), titanium (Ti), zirconium (Zr), chromium (Cr), molybdenum (Mo), and silicon (Si). Additionally, examples of carbides include tungsten carbide (WC), silicon carbide (SiC), titanium carbide (TiC), zirconium carbide (ZrC), and mixtures thereof amount others.

The nucleation enhancer layer when used, is a layer which is thin enough that it does not to adversely affect the transfer of the intended configuration from the interface surface to the working surface. In one aspect, the thickness of the nucleation enhancer layer may be less than about 0.1 micrometers. In another aspect, the thickness may be less than about 10 nanometers. In yet another aspect, the thickness of the nucleation enhancer layer is less than about 5 nanometers. In a further aspect of the invention, the thickness of the nucleation enhancer layer is less than about 3 nanometers.

The thickness of the diamond or other superabrasive material layer may be any thickness desired. In one aspect multiple layers of diamond may be deposited over one another using CVD techniques while in the mold, or after the initial layer has been formed and removed from the mold to form a consolidated layer of desired thickness. In one aspect, the diamond layer may be thickened after the deposition of the initial film, using non-CVD techniques, as are known in the art of diamond fabrication and consolidation. In another aspect of the invention, such thickening may take place while the initial diamond layer is still in the mold, or after it has been removed (e.g. by dissolution in acid). In yet another aspect of the invention, the diamond layer fabricated may have a thickness of from about 30 micrometers to about 200 micrometers. In an additional aspect of the invention, the diamond layer may have a thickness of less than about 100 micrometers. In a further aspect of the invention, the diamond layer may have a thickness of about 200 micrometers.

Any CVD process may be used to create the diamond or other superabrasive layer for the tool of the present invention. Many methods are known in the art, and may be selected by the skilled artesian to achieve a particularly desired result. In one aspect of the invention, the CVD technique employed in the process of the present invention is a member selected from the group consisting of: hot filament, microwave plasma, oxyacetylene flame, and direct current arc techniques. Further, the reactant gasses used during such techniques may be any which are known in the art as useful for safely accomplishing diamond layer fabrication using a selected CVD technique. However, in one aspect, the gases used in the CVD technique are a combination of methane and hydrogen gasses.

After the diamond or other superabrasive layer has been deposited on the interface surface of the mold, or the nucleation enhancer layer, the mold, as well as the nucleation enhancer layer if used, may be separated from the diamond using any mechanism suitable for removing the particular substance from which the mold and nucleation enhancer layer is fabricated. In one aspect of the present invention, the mold is chemically removed from the diamond or other superabrasive layer, such as by dissolution thereof with acid. In another aspect, the mold is physically removed from the diamond or other superabrasive layer, for example by grit blasting or mechanical polishing. In yet another aspect, the mold is removed from the diamond or other superabrasive layer using a heat or cold treatment, such as a furnace for melting the mold, or liquid nitrogen for freezing and crumbling the mold. In a further aspect, separation of the mold from the diamond or superabrasive film due to heating or cooling may be a result of different thermal expansion properties between the mold material and the diamond material.

For certain applications, such as in SAW filters, a portion of the mold, and nucleation enhancer layer, if used, may be left in contact with the diamond or other superabrasive material layer. In such instances, the portion of the mold which remains becomes an integral part of the finished tool. In order to produce a finished product under these circumstances, in some aspects, the outside surface of the mold may be polished or shaped to provide a desired configuration or thickness therefor, if such work has not been accomplished prior to the fabrication of the diamond layer. In one aspect, the thickness of the original mold may be any thickness or configuration required to produce a specific tool. In another aspect, the thickness may be greater than about 1 millimeter. In yet another aspect, the thickness may be greater than about 5 millimeters. In an additional aspect, the outside surface of the mold may be polished or shaped to have a configuration required to produce a specific tool. In a further aspect, the mold may be polished or shaped into a layer have a thickness of less than about 1 micrometer. In another aspect, the thickness may be less than about 0.1 micrometer. Further, when making a SAW filter, a plurality of interdigital transducers may be coupled to either the outside or interface surface of the mold.

Either before or after the mold, and nucleation enhancer layer if used, or a portion thereof, is removed from the diamond or other superabrasive layer, the layer may be joined to a non-diamond tool body, or intermediate substrate for incorporation into a tool body. Materials for such tool bodies and substrates include any materials suitable for, or required by, a particular tool shape, use, or function. Examples without limitation include resins, metals, silicon, ceramics and composites thereof.

In addition to the attachment of a tool body, additional components may be formed upon the exposed working surface of the diamond layer after removal of the mold, and nucleation enhancer layer if used. In one aspect, a piezoelectric layer as recited above, may be formed upon the working surface of the diamond layer in order to form a SAW filter. The types of tools which can be fabricated using the process of the present invention are any tool for which an advantage may be found for incorporating diamond or other superabrasive material therein. In many cases, the present invention enables tools to be constructed with a configuration which was difficult, if not impossible using methods known in the prior art. Examples without limitation include tools requiring a hole or channel having a non-rounded or non-circular shape such as a square shape, which cannot be fabricated using a drill bit, or other tools which require intricate working surface ornamentation such as coils in a pipe, or other delicate structures, etc. By way of specific example without limitation, coiled pipes, drawing dyes, such as wire drawing dyes, and extruding dyes may be made. Other shapes such as convex, concave, and diaphragm shapes, or configurations, as well as working surface micro-characteristics, such as rough and smooth surfaces may be easily produced using the method of the present invention. By way of example without limitation, speaker diaphragms, such as tweeter diaphragms may be produced. In yet another example, SAW filters may be produced using the method of the present invention. One significant advantage in these types of applications which require a very smooth working surface, is that because little or no working surface machining is necessary after removing the mold, the number of variations, microcracks or fissures which are caused by such machining is substantially reduced, or eliminated. The reduced incidence of variations, including microcracks on the working surface greatly enhances the quality of the input signal received, or the output signal produced.

As the nucleation surface of the diamond layer is to be the working surface of the tool, care should be taken to ensure that this surface is of the highest quality and integrity possible. Different degrees of quality may be achieved during the CVD process, as required by the particular application of the tool being fabricated. Those of ordinary skill in the art will readily recognized the differing conditions and techniques which produce a given degree of quality, and will be able to achieve various degrees of quality without undue experimentation.

Various methods may be employed to increase the quality of the diamond in the nucleation surface of the diamond layer which is created by CVD techniques. For example, diamond particle quality may be increased by reducing the methane flow rate, and increasing the total gas pressure during the early phase of diamond deposition. Such measures, decrease the decomposition rate of carbon, and increase the concentration of hydrogen atoms. Thus a significantly higher percentage of the carbon will be deposited in an $sp^3$ bonding configuration, and the quality of the diamond nuclei formed is increased. Additionally, the nucleation rate of diamond particles deposited on the diamond interface surface of the mold or the nucleation enhancer layer, may be increased in order to reduce the amount of interstitial space between diamond particles. Examples of ways to increase nucleation rates include, but are not limited to: applying a negative bias in an appropriate amount, often about 100 volts, to the diamond interface surface of the mold; polishing the diamond interface surface of the mold with a fine diamond paste or powder, which may partially remain on the interface surface; and controlling the composition of the diamond interface surface. Other methods of increasing diamond nucleation will be readily apparent to those skilled in the art.

In one aspect of the present invention, the interface surface of a mold may be polished using a diamond tool, or diamond powder in order to achieve a particular surface ornamentation. Polishing with diamond powder, or paste is especially useful when an ultra-smooth interface surface is desired. Further, when a fine diamond paste is used to polish the interface surface, many diamond particles may become embedded in the diamond interface surface, and can serve as seeds for increased nucleation rates. Certain metals, such as iron, nickel, cobalt, and their alloys, are known to catalyze diamond into amorphous carbon or graphite at high temperatures (i.e. greater than 700° C.). Thus, by limiting the amount of such substance in the composition of the interface surface of the mold, the amount of diamond which will be catalyzed to graphite is greatly reduced, and the overall quality of the nucleation surface is increased.

In one aspect, tungsten carbide may be used as the material for the mold, including the diamond interface surface thereof. However, by limiting the amount of cobalt binder contained therein to less than about 4% w/w, the incidence of diamond catalysis is greatly reduced. Further, it has been found that binder free tungsten carbide materials may be used to greatly reduce diamond catalysis. Additionally, it has been found that using ultra fine, or sub-micron tungsten carbide grains creates a very smooth diamond interface surface which increases diamond nucleation. Additionally, the smooth micro-configuration of the interface surface is imparted to the working surface of the diamond layer.

Thus a diamond tool of the present invention may comprise a diamond layer having a working surface which is the nucleation surface of the diamond layer, and a non-diamond layer joined to the grown side of the diamond layer. Further, the process of making a diamond tool in accordance with the present invention may include the steps of: a) molding the working surface of a diamond layer for a tool into a desired configuration using a suitable mold, b) separating the mold from the diamond layer, and c) joining the diamond layer to a non-diamond substrate, such that the nucleation surface of the diamond layer becomes the working surface of the tool.

C. EXAMPLES

Figure 3B:
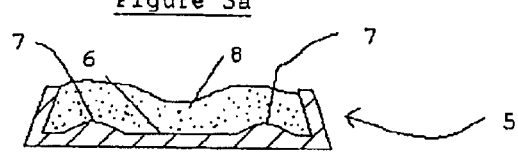
FIG. 3b is a cross section view of a diamond mass formed in an ephemeral mold for fabricating a diamond cutting element, or insert, in accordance with one aspect of the present invention.
Figure 3C:
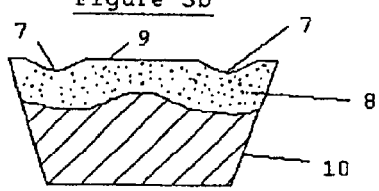
FIG. 3c is a cross section of a diamond cutting element, or insert formed in accordance with one aspect of the present invention.

Referring now to FIGS. 3a–3c, is shown an example of various points in the process of making a cutting element, or insert in accordance with the present invention. FIG. 3a shows metal mold 5, having an interface surface 6, in the inverse shape of a cutting insert, including chip breakers 7, for cutting ductile materials. FIG. 3b shows a diamond or other superabrasive material layer or mass 8, which has been deposited within the mold 5, upon the interface surface 6, using a CVD process. Thus, the layer receives the inverse configuration of the interface surface.

After the diamond layer 8 is deposited upon diamond interface surface 6, it may be thickened to any desired thickness. Such thickening may be accomplished by continuous deposition of diamond by the CVD process, or by using other methods of consolidating and making diamond masses as are known to those of ordinary skill in the art.

As shown in FIG. 3c, following completion of diamond layer 8, the mold 5 is removed, for example by chemical etching, and the diamond layer 8 is joined with non-diamond substrate 10 to form a cutting element. The attachment of diamond layer 8 to non-diamond material 10 may be accomplished by any method known to those skilled in the art, such as gluing, brazing, infiltration, etc.

Of particular note is that working surface 9, is the nucleation surface of diamond layer 8, which was in direct contact with the interface surface 6 of the mold 5. As such, the inverse configuration of the interface surface, has been imparted to working surface.

Figure 4A:
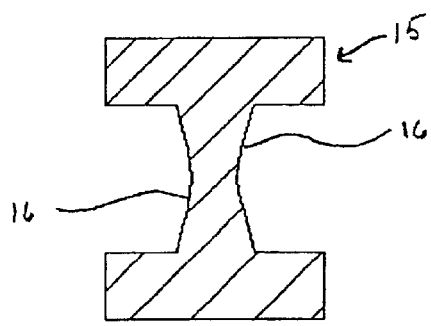
FIG. 4a is a cross section view of an metal mold for fabricating a die, such as a wire drawing dye, or an extrusion dye in accordance with one aspect of the present invention. Further, the metal mold as well as molds with a similar or slightly varied configuration may be used to fabricate nozzles, such as waterjet nozzles in accordance with an additional aspect of the present invention.
Figure 4C:
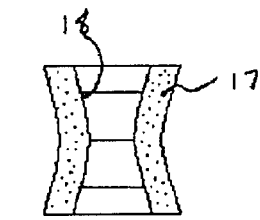
FIG. 4c is a cross section view of a diamond working surface for use in a die or nozzle in accordance with one aspect of the present invention.
Figure 4B:
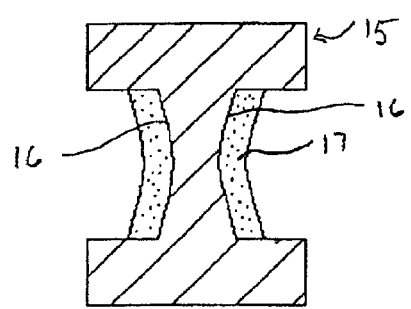
FIG. 4b is a cross section view of a diamond mass formed on an ephemeral mold for fabricating a die or nozzle in accordance with one aspect of the present invention.
Figure 4D:
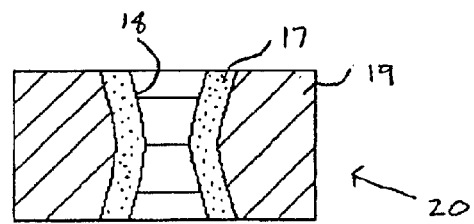
FIG. 4d is a cross section view of a diamond die or nozzle formed in accordance with one aspect of the present invention.

Referring now to FIGS. 4a–4d, there is shown an example of various points in the process for making a die, such as a wire drawing dye or an extrusion dye, in accordance with the present invention. Further, the process and structures represented may be used for making a nozzle, such as a water jet nozzle. FIG. 4a shows a mold 15 having an interface surface 16 inversely configured to impart a desired shape to a die or nozzle. FIG. 4b shows a diamond or other superabrasive material layer 17 deposited upon the interface surface of the mold. The mold is removed, for example by dissolving it with chemicals, and FIG. 4c shows resultant diamond layer, having newly a exposed working surface 18, which was the nucleation surface of the diamond layer, during its formation.

Following the removal of mold 15, a non-diamond mass 19 may be joined to the diamond or other superabrasive material layer 17, using any method known in the art, such as gluing, brazing, infiltrating, or other type of bonding, to join the diamond layer with the non-diamond mass, to form a wire drawing die 20. Additionally, an outer ring of stainless steel, copper, or the like, (not shown) may be placed on the perimeter of non-diamond mass 19, prior to its attachment to diamond layer 17. The space created between diamond layer, and the outer ring is filled with a non-diamond material 19 (e.g. WC grain), and infiltrated (e.g. by a copper alloy) to create a composite tool.

Referring now to FIGS. 5a–5d there is shown an example of various points in the process for making a chemical mechanical polishing (CMP) pad dresser in accordance with the present invention. FIG. 5a shows a mold 21 made of a suitable material, such as silicon, having an interface surface 22, configured to impart a desired shape to the CMP pad dresser. FIG. 5b shows a diamond or other superabrasive material layer 23 deposited upon the interface surface of the mold, using a CVD technique. As discussed above, the diamond layer may be thickened to any desired thickness, using any of the methods known to one of ordinary skill in the art.

FIG. 5c shows a hard substrate layer 25, which has been joined to the diamond layer 23 by an epoxy layer 24. Attachment of hard substrate layer to the diamond layer may otherwise be accomplished by any method known to those skilled in the art, including sintering, infiltration, etc., as described above. Subsequent or prior to the attachment of the substrate by the epoxy resin layer to the diamond layer, the mold 21 may be removed by a process, such as chemical dissolution with a strong acid, thus exposing the working surface 26 of diamond layer 23, as shown in FIG. 5d. Notably, the working surface was the nucleation surface of the diamond layer during its fabrication, and has a configuration which inversely corresponds to interface surface 22 of the mold.

Referring now to FIGS. 6a–6d, there is shown an example of various points in the process for making a diamond or superabrasive pipe in a coiled configuration in accordance with the present invention. FIG. 6a shows a mold 27 in the shape of a coiled wire or pipe, having an interface surface 28. Diamond or another superabrasive material is deposited upon the interface surface using a CVD technique, and FIG. 6b shows the diamond or other superabrasive material layer 29 which is formed on the interface surface of the mold as shown in FIG. 6a. The diamond layer may be thickened to any desired thickness using any of the afore-mentioned methods known in the art of creating diamond masses.

Prior or subsequent to the formation of the diamond layer 29, the mold 27 may be removed by a suitable method such as chemical etching, heating, cooling, or dissolution. The removal of the mold exposes the nucleation surface of the diamond layer, which becomes the working surface 30. Notably, the working surface inversely corresponds to the configuration of the interface layer 28.

After the removal of the mold 27, the diamond layer 29 may be overlaid with a substance, such as acrylic resin 31, to facilitate handling, and a complete diamond pipe 32, as shown in FIG. 6d is produced. Such pipes are useful in the transportation of corrosive and otherwise harmful fluids and gases (e.g. hydrofluoric gas). Further, such pipes are useful for the transportation of sterilized fluid, which may otherwise be corrupted by reaction with a substance which is less inert than diamond.

Referring now to FIGS. 7a–f is shown a process for making a SAW filter 50 in accordance with one aspect of the present invention. Ceramic mold 55 is provided having an interface surface 60, upon which a thin nucleation enhancer layer 65 is formed and outside surface 100. As recited above, the interface surface, may be polished to an extremely high smoothness for various applications, and the outside surface may be polished or shaped to any configuration required to form a specific tool, when the mold becomes part of the tool as described herein. Diamond layer 70 is then grown on the thin nucleation enhancer layer using one of various known CVD processes. The working surface 75 of the diamond layer is the nucleation surface, and is in direct contact with the thin nucleation enhancer layer. The interface surface is configured to inversely match a configuration intended for a working surface 75 of the diamond layer, and because of the thinness of the nucleation enhancer layer, such a configuration is easily transferred thereto. Note that in actual use, the thin nucleation layer is only a few nanometers thick. However, for the purposes of adequate representation in the present drawings, the thin nucleation layer is shown on a much larger scale with respect to the other components than in actual use.

Following formation of the diamond layer 70, the growth side 80 thereof is mounted on or against a substrate 85. The substrate may be of any suitable material as selected by one skilled in the art and may be attached by any mechanism suitable for the specific substrate material chosen. In one aspect, the substrate may be an epoxy or other resin. Either prior to or following attachment to the substrate, and following any polishing or shaping of outside surface 100, if required, a plurality of interdigital transducers 90 (i.e. electrodes) may be mounted on top of the piezoelectric material by any of a variety of mechanisms known to those skilled in the art for such positioning and attachment. Notably, the IDT may also be formed on the interface surface 60, prior to the growth of the diamond layer in certain applications.

As depicted in FIG. 7d, when the ceramic mold 55 is a piezoelectric layer, the thin nucleation enhancer layer 65 may be left in place according to one aspect of the present invention and becomes part of the finished product. However, in accordance with another aspect of the present invention, as depicted in FIGS. 7e–7f, the nucleation enhancer layer and the ceramic mold may be removed by a suitable mechanism as described above, and then a piezoelectric layer and interdigital transducers may be formed upon the working surface 75 of the diamond layer 70. It is to be noted that the ceramic mold and thin nucleation layer may be used with any configuration in order to create any tool otherwise described herein, as well as others that will be readily recognized by those skilled in the art.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of making a diamond tool comprising the steps of:
   a) providing a ceramic mold having an interface surface configured to inversely match a configuration intended for a working surface of the tool;
   b) forming a thin nucleation enhancer layer on the interface surface; and
   c) growing a diamond layer on the nucleation enhancer layer using a CVD technique, such that the working surface directly contacts the nucleation enhancer layer and receives the intended configuration from the interface surface of the mold.

2. The method of claim 1, wherein the ceramic mold is made substantially of a material selected from the group consisting of: oxides, nitrides, and mixtures thereof.

3. The method of claim 2, wherein the oxide material is a member selected from the group consisting of: $SiO_2$, $Al_2O_3$, $LiTaO_3$, $LiNbO_3$, ZnO, glass, and mixtures thereof.

4. The method of claim 3, wherein the oxide material is $Al_2O_3$.

5. The method of claim 4, wherein the nitride material is a member selected from the group consisting of: $Si_3N_4$, AlN, BN, TiN, ZrN, and mixtures thereof.

6. The method of claim 5, wherein the nitride material is $Si_3N_4$.

7. The method of claim 1, wherein the nucleation enhancer layer has a thickness of less than about 0.1 micrometers.

8. The method of claim 1, wherein the nucleation enhancer layer is made substantially of a material selected from the group consisting of: metals, metal alloys, metallic compounds, carbides, carbide formers, and mixtures thereof.

9. The method of claim 8, wherein the nucleation enhancer layer is made substantially of a carbide former selected from the group consisting of: tungsten (W), tantalum (Ta), titanium (Ti), zirconium (Zr), chromium (Cr), silicon (Si), molybdenum (Mo) and mixture thereof.

10. The method of claim 8, wherein the nucleation enhancer layer is made substantially of a carbide selected from the group consisting of: tungsten carbide (WC), silicon carbide (SiC), titanium carbide (TiC), zirconium carbide (ZrC) and mixtures thereof.

11. The method of claim 1, wherein the interface surface has a surface roughness (Ra) of less than about 1 micrometer and wherein the working surface produced receives a surface roughness (Ra) of less than about 1 micrometer.

12. The method of claim 1, wherein the ceramic mold is a piezoelectric material.

13. The method of claim 12, wherein the piezoelectric material is a member selected from the group consisting of: $SiO_2$, $Si_3N_4$, $Al_2O_3$, AlN, GaAs, GaP, $LiTaO_3$, $LiNbO_3$, ZnO, $Pb(Zr, Ti)O_3$, $Ta_2O_5$ $Nb_2O_5$, BeO, $L_2B_4O_7$, $KnbO_3$, ZnS, ZnSe, CdS, and mixtures thereof.

14. The method of claim 12, wherein the piezoelectric material is provided from a single crystal ingot.

15. The method of claim 1, wherein the tool is a surface acoustic wave (SAW) filter.

16. The method of claim 1, further comprising the step of:
   separating the ceramic mold and nucleation enhancer layer from the diamond layer to expose the working surface.

17. The method of claim 16, wherein said interface surface has a concave configuration.

18. The method of claim 16, wherein said interface surface has a convex configuration.

19. The method of claim 16, wherein said interface surface configuration inversely corresponds to the shape of a die.

20. The method of claim 19, wherein said die has a channel with a non-spherical shape.

21. The method of claim 19, wherein the die is a wire drawing die.

22. The method of claim 19, wherein the die is an extrusion die.

23. The method of claim 16, wherein said interface surface configuration inversely corresponds to the shape of a chemical mechanical polishing (CMP) pad dresser.

24. The method of claim 16, wherein said interface surface configuration inversely corresponds to the shape of a pipe.

25. The method of claim 16, wherein said interface surface configuration inversely corresponds to the shape of a diaphragm.

26. The method of claim 16, wherein said interface surface configuration inversely corresponds to the shape of a cutting element.

27. The method of claim 26, wherein said cutting element contains chip breakers.

28. The method of claim 16, wherein said interface surface configuration inversely corresponds to the shape of a SAW filter.

29. The method of claim 16, wherein said interface surface configuration inversely corresponds to the shape of a nozzle.

30. The method of claim 16, wherein step of separating is accomplished by chemically removing the mold from the diamond layer.

31. The method of claim 16, further comprising the step of forming a layer of piezoelectric material on the working surface.

32. The method of claim 31, wherein the tool is a SAW filter.

33. The method of either claims 1 or 16, further comprising the step of attaching said diamond layer to a non-diamond material for incorporation into a tool.

34. A method of making a diamond tool comprising the steps of:
   a) providing a mold having an interface surface configured to inversely match a configuration intended for a working surface of the tool, said mold being made of a material selected from the group consisting of $SiO_2$, $Si_3N_4$, $Al_2O_3$, AlN, GaAs, GaP, $LiTaO_3$, $LiNbO_3$, ZnO, $Pb(Zr, Ti)O_3$, $Ta_2O_5$ $Nb_2O_5$, BeO, $L_2B_4O_7$, $KnbO_3$, ZnS, ZnSe, CdS, and mixtures thereof;
   b) forming a thin nucleation enhancer layer on the interface surface, said nucleation enhancer being made of a material selected from the group consisting of tungsten (W), tantalum (Ta), titanium (Ti), zirconium (Zr), chromium (Cr), silicon (Si), molybdenum (Mo), carbides thereof, and mixtures thereof,
   c) growing a diamond layer on the nucleation enhancer layer using a CVD technique, such that the working surface directly contacts the nucleation enhancer layer and receives the intended configuration from the interface surface of the mold; and
   d) chemically separating the ceramic mold and nucleation enhancer layer from the diamond layer to expose the working surface.

35. The method of claim 34, wherein the nucleation enhancer layer has a thickness of less than about 0.1 micrometers.

36. The method of claim 35, wherein the interface surface has a surface roughness (Ra) of less than about 1 micrometer and wherein the working surface produced receives a surface roughness (Ra) of less than about 1 micrometer.

37. The method of claim 36, wherein the mold material is provided from a single crystal ingot.

38. The method of claim 37, wherein the tool is a surface acoustic wave (SAW) filter.

39. The method of claim 34, wherein said interface surface has a concave configuration.

40. The method of claim 34, wherein said interface surface has a convex configuration.

41. The method of claim 34, wherein said interface surface configuration inversely corresponds to the shape of a die.

42. The method of claim 41, wherein the die is a wire drawing die.

43. The method of claim 41, wherein the die is an extrusion die.

44. The method of claim 34, wherein said drawing die has a channel with a non-spherical shape.

45. The method of claim 34, wherein said interface surface configuration inversely corresponds to the shape of a chemical mechanical polishing (CMP) pad dresser.

46. The method of claim 34, wherein said interface surface configuration inversely corresponds to the shape of a pipe.

47. The method of claim 34, wherein said interface surface configuration inversely corresponds to the shape of a diaphragm.

48. The method of claim 34, wherein said interface surface configuration inversely corresponds to the shape of a cutting element.

49. The method of claim 48, wherein said cutting element contains chip breakers.

50. A method of making a diamond tool consisting of the steps of:
   a) providing a ceramic mold having an interface surface configured to inversely match a configuration intended for a working surface of the tool;
   b) forming a thin nucleation enhancer layer on the interface surface;
   c) growing a diamond layer on the nucleation enhancer layer using a CVD technique, such that the working surface directly contacts the nucleation enhancer layer and receives the intended configuration from the interface surface of the mold;
   d) polishing an outside surface of the mold; and
   e) forming a plurality of interdigital transducers (IDT) on the outside surface.

51. The method of claim 50, wherein the nucleation enhancer is made substantially of a material selected from the group consisting of: metals, metal alloys, metallic compounds, carbides, carbide formers, and mixtures thereof.

52. The method of claim 51, wherein the nucleation enhancer is a carbide former selected from the group consisting of: tungsten (W), tantalum (Ta), titanium (Ti), zirconium (Zr), chromium (Cr), silicon (Si), molybdenum (Mo) and mixture thereof.

53. The method of claim 52, wherein the nucleation enhancer is a carbide selected from the group consisting of: tungsten carbide (WC), silicon carbide (SiC), titanium carbide (TiC), zirconium carbide (ZrC), and mixtures thereof.

54. The method of claim 50, wherein the interface surface has a surface roughness (Ra) of less than about 1 micrometer and wherein the working surface produced receives a surface roughness (Ra) of less than about 1 micrometer.

55. The method of claim 50, wherein the ceramic mold is a piezoelectric material.

56. The method of claim 55, wherein the piezoelectric material is a member selected from the group consisting of: $SiO_2$, $Si_3N_4$, $Al_2O_3$, AlN, GaAs, GaP, $LiTaO_3$, $LiNbO_3$, ZnO, Pb(Zr, Ti)$O_3$, $Ta_2O_5$ $Nb_2O_5$, BeO, $L_2B_4O_7$, $KnbO_3$, ZnS, ZnSe, CdS, and mixtures thereof.

57. The method of claim 55, wherein the piezoelectric material is provided from a single crystal ingot.

58. The method of claim 50, wherein the tool is a surface acoustic wave (SAW) filter.

59. A method of making a diamond tool consisting of the steps of:
a) providing a mold of piezoelectric material having an interface surface with a roughness (Ra) less than about 1 nanometer, configured to inversely match a configuration intended for a working surface of the tool, said piezoelectric material being provide from a single crystal ingot selected from the group consisting of: $SiO_2$, $Si_3N_4$, $Al_2O_3$, AlN, GaAs, GaP, $LiTaO_3$, $LiNbO_3$, ZnO, Pb(Zr, Ti)$O_3$, $Ta_2O_5$ $Nb_2O_5$, BeO, $L_2B_4O_7$, $KnbO_3$, ZnS, ZnSe, CdS, and mixtures thereof;
b) forming a thin nucleation enhancer layer on the interface surface, said nucleation enhancer being made of a material selected from the group consisting of: tungsten (W), tantalum (Ta), titanium (Ti), zirconium (Zr), chromium (Cr), silicon (Si), molybdenum (Mo), carbides thereof, and mixtures thereof;
c) growing a diamond layer on the nucleation enhancer layer using a CVD technique, such that the working surface directly contacts the nucleation enhancer layer and receives the intended configuration from the interface surface of the mold;
d) polishing an outside surface of the mold; and
e) forming a plurality of interdigital transducers (IDT) on the outside surface.

60. A method of making a diamond tool comprising the steps of:
a) providing a carbide mold having an interface surface configured to inversely match a configuration intended for a working surface of the tool; and
b) growing a diamond layer on the interface surface using a CVD technique, such that the working surface directly contacts the interface surface and receives the intended configuration from the interface surface of the mold.

61. The method of claim 60, further comprising the step of:
separating the carbide mold from the diamond layer to expose the working surface.

62. The method of claim 60, wherein the carbide is a member selected from the group consisting of: tungsten carbide (WC), silicon carbide (SiC), titanium carbide (TiC), zirconium carbide (ZrC) and mixtures thereof.

63. The method of claim 60, wherein the interface surface has a surface roughness (Ra) of less than about 1 micrometer and wherein the working surface produced receives a surface roughness (Ra) of less than about 1 micrometer.

64. The method of claim 60, wherein the carbide is piezoelectric.

65. The method of claim 64, wherein the tool is a SAW filter.

66. A method of making a diamond tool consisting of the steps of:
a) providing a carbide mold having an interface surface configured to inversely match a configuration intended for a working surface of the tool;
b) growing a diamond layer on the interface surface using a CVD technique, such that the working surface directly contacts the interface surface and receives the intended configuration from the interface surface of the mold;
c) polishing an outside surface of the mold; and
d) forming a plurality of interdigital transducers (IDT) on the outside surface.

67. A method of making a diamond tool comprising the steps of:
a) providing a nitride mold having an interface surface configured to inversely match a configuration intended for a working surface of the tool; and
b) growing a diamond layer on the interface surface using a CVD technique, such that the working surface receives the intended configuration from the interface surface of the mold.

68. The method of claim 67, further comprising the step of:
separating the nitride mold from the diamond layer to expose the working surface.

69. The method of claim 67, wherein the nitride material is a member selected from the group consisting of: $Si_3N_4$, AlN, BN, TiN, ZrN, and mixtures thereof.

70. The method of claim 67, wherein the interface surface has a surface roughness (Ra) of less than about 1 micrometer and wherein the working surface produced receives a surface roughness (Ra) of less than about 1 micrometer.

71. The method of claim 67, wherein the nitride layer is provide as a single crystal ingot.

72. The method of claim 67, wherein the tool is a SAW filter.

73. A method of making a diamond tool consisting of the steps of:
a) providing a nitride mold having an interface surface configured to inversely match a configuration intended for a working surface of the tool;
b) growing a diamond layer on the interface surface using a CVD technique, such that the working surface directly contacts the interface surface and receives the intended configuration from the interface surface of the mold;
c) polishing an outside surface of the mold; and
d) forming a plurality of interdigital transducers (IDT) on the outside surface.

* * * * *